US008877615B2

(12) United States Patent
Basker et al.

(10) Patent No.: US 8,877,615 B2
(45) Date of Patent: Nov. 4, 2014

(54) METHODS OF MANUFACTURING FINFET DEVICES

(75) Inventors: Veeraraghavan S. Basker, Schenectady, NY (US); David V. Horak, Essex Junction, VT (US); Hemanth Jagannathan, Guilderland, NY (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 13/431,770

(22) Filed: Mar. 27, 2012

(65) Prior Publication Data
US 2012/0190179 A1 Jul. 26, 2012

Related U.S. Application Data

(62) Division of application No. 12/815,845, filed on Jun. 15, 2010, now Pat. No. 8,368,146.

(51) Int. Cl.
*H01L 21/20* (2006.01)
*H01L 29/66* (2006.01)
*H01L 21/8238* (2006.01)
*H01L 29/78* (2006.01)

(52) U.S. Cl.
CPC ........ *H01L 29/785* (2013.01); *H01L 29/66795* (2013.01); *H01L 21/823807* (2013.01); *H01L 29/7843* (2013.01); *H01L 29/7845* (2013.01); *H01L 21/823821* (2013.01)
USPC ........................................ 438/479

(58) Field of Classification Search
CPC ................. H01L 29/41791; H01L 29/66795; H01L 29/785; H01L 21/823821; H01L 21/845; H01L 21/823431; H01L 21/823807
USPC ........................................ 438/479.585, 595
See application file for complete search history.

(56) References Cited
U.S. PATENT DOCUMENTS

| 6,210,866 | B1 * | 4/2001 | Furukawa et al. | 430/313 |
|---|---|---|---|---|
| 6,977,194 | B2 * | 12/2005 | Belyansky et al. | 438/197 |
| 7,045,401 | B2 | 5/2006 | Lee et al. | |
| 7,115,945 | B2 | 10/2006 | Lee et al. | |
| 7,314,802 | B2 | 1/2008 | Zhu et al. | |
| 7,384,830 | B2 * | 6/2008 | Cohen | 438/153 |
| 7,531,853 | B2 | 5/2009 | Saito et al. | |
| 8,053,809 | B2 | 11/2011 | Cheng et al. | |
| 2004/0075122 | A1 * | 4/2004 | Lin et al. | 257/288 |

(Continued)

FOREIGN PATENT DOCUMENTS

JP 2009105155 5/2009

OTHER PUBLICATIONS

Notice of allowance for U.S. Appl. No. 12/815,845 dated Sep. 26, 2012.
Office Action for U.S. Appl. No. 12/815,845 dated Jun. 20, 2012.

(Continued)

*Primary Examiner* — Nikolay Yushin
(74) *Attorney, Agent, or Firm* — Joe Abate; Roberts Mlotkowski Safran & Cole, P.C.

(57) ABSTRACT

A finFET structure and method of manufacture such structure is provided with lowered Ceff and enhanced stress. The finFET structure includes a plurality of finFET structures and a stress material forming part of a gate stack and in a space between adjacent ones of the plurality of finFET structures.

12 Claims, 4 Drawing Sheets

(56) References Cited

U.S. PATENT DOCUMENTS

| | | |
|---|---|---|
| 2005/0145932 A1 | 7/2005 | Park et al. |
| 2005/0205932 A1* | 9/2005 | Cohen ............................ 257/347 |
| 2006/0118876 A1 | 6/2006 | Lee et al. |
| 2007/0152277 A1 | 7/2007 | Shima |
| 2008/0121896 A1* | 5/2008 | Takizawa et al. ............... 257/76 |
| 2008/0173942 A1 | 7/2008 | Zhu et al. |
| 2009/0169845 A1* | 7/2009 | Leu et al. ....................... 428/216 |
| 2010/0301417 A1 | 12/2010 | Cheng et al. |
| 2010/0308381 A1 | 12/2010 | Luning et al. |
| 2011/0127610 A1 | 6/2011 | Lee et al. |

OTHER PUBLICATIONS

Office Action for related U.S. Appl. No. 13/613,534 dated Feb. 5, 2014, 13 pages.

Notice of Allowance for related U.S. Appl. No. 13/613,534 dated May 23, 2014, 8 pages.

* cited by examiner

METHODS OF MANUFACTURING FINFET DEVICES

CROSS REFERENCE TO RELATED APPLICATIONS

The present application is a divisional application of co-pending U.S. application Ser. No. 12/815,845, filed on Jun. 15, 2010, the contents of which are incorporated by reference in its entirety herein.

FIELD OF THE INVENTION

The invention relates to semiconductor structures and methods of manufacture and, more particularly, to a finFET structure with lowered Ceff and enhanced stress and methods of manufacturing the same.

BACKGROUND

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions.

Two of the main detractors for realizing such finFET device technology are the higher Ceff and ineffectiveness of conventional stress elements such as eSiGe or stress liner. Any innovation in device architecture which can reduce either of these components will help in improving the performance of the finFET device circuits In order to reduce the high resistance of thin body Si, finFET or trigates are typically merged in the source drain (S/D) area to reduce the external resistance. However, with such device integration, the Ceff of the device is higher since there is a finite gate-to-EPI capacitance as the conductive part of the gate in non-fin areas and the EPI merge is separated by the spacer. Such dead areas in the gate cannot be avoided in finFET or trigates devices.

Accordingly, there exists a need in the art to overcome the deficiencies and limitations described hereinabove.

SUMMARY

In a first aspect of the invention, a finFET structure comprises a plurality of finFET structures and a stress material forming part of a gate stack and in a space between adjacent ones of the plurality of finFET structures.

In another aspect of the invention, a finFET structure comprises a plurality of finFET gate structures comprising a gate material deposited on a dielectric material. The finFET structure further comprises an insulator stress material provided in a space between each fin of the plurality of finFET gate structures and on sides of the fins. The finFET structure further comprises a conductive layer on the insulator stress material. The insulator stress material has a lattice constant different than that of the gate material used for the plurality of finFET gate structures.

In yet another aspect of the invention, a method comprises forming finFET gate structures by depositing gate material and dielectric material on patterned fins. The method further comprises merging the finFET gate structures by depositing and patterning insulative stress material on sides of adjacent finFET gate structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the coplanar waveguide structure (CPW), which comprises the structures of the present invention. In still further embodiments, a method in a computer-aided design system is provided for generating a functional design model of the CPW. The method comprises generating a functional representation of the structural elements of the CPW.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a finFET structure with lowered Ceff and enhanced stress and methods of manufacturing the same. More specifically, the finFET structure of the present invention includes stress material in non-fin areas. In embodiments, the stress material can be placed between the fins. In the integration scheme of the present invention, the Ceff of the device can be decreased as well as stress can be imparted in the device using the stress material. In embodiments, imparting stress from the gate is very effective for finFETs since the gate wraps around the fins and the channel can be stressed from both sides. The additional benefit of using stress materials is that such stress materials are typically insulators (e.g., nitride) and hence, the gate-to-EPI capacitance of conventional systems is eliminated completely.

In the present invention, the fins of the finFET are formed using conventional fabrication processes, e.g., SIT (sidewall image transfer). The gate stack is formed on the fins by depositing and patterning insulator material such as, for example, a high-K material, followed by gate material such as, for example, metal or poly. In case of materials such as TiN or TaN for the gate material, since the resistance of the material may present an issue, it can be followed by a high conductivity metal which is used for decreasing the resistance of the metal gate along the fin height. Post gate stack deposition, insulating stress material is deposited, which stresses the channel directly from the gate. Using chemical mechanical polishing (CMP), for example, the stress material is planarized stopping on top of the gate or the fin cap. In order to provide electrical connection to all the gates around the fin-FETs, a conducting metal layer can be deposited and the gates patterned. In embodiments, when the top of the gate structure is a metal, this will also help with forming borderless contacts.

Figure 1:
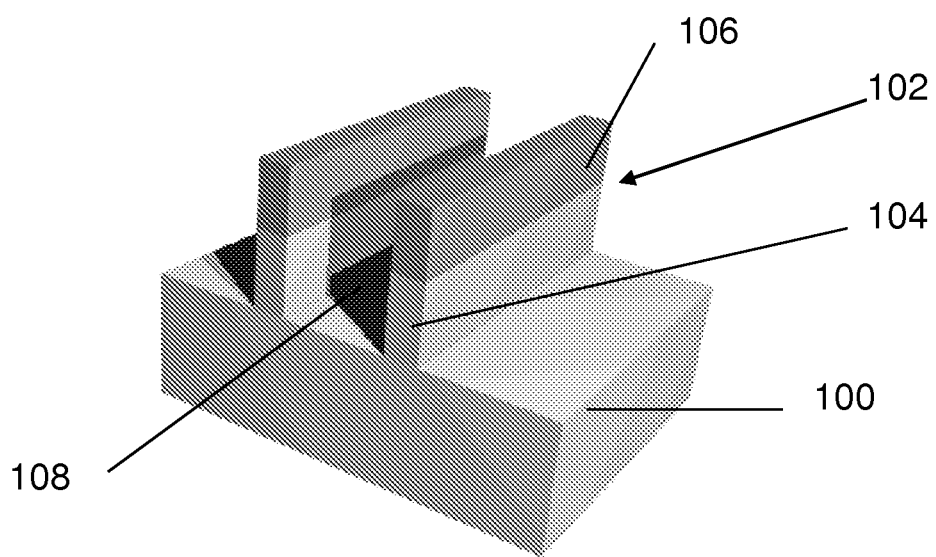
FIG. 1 shows a beginning structure and respective processing steps in accordance with aspects of the invention.

FIG. 1 shows a beginning structure and respective processing steps in accordance with aspects of the invention. The structure includes a substrate 100 with a plurality of fins 102 comprising SOI material 104 and an insulator material 106 such as, oxide. Although two fins are shown, it should be understood that the plurality of fins can be any number of fins, for a particular chip. The oxide material, for example, can be a hard mask or capping layer. In embodiments, the fins 102 can be formed by deposition of the SOI material and insulator material using, for example, a conventional deposition process such as a chemical vapor deposition. In embodiments, the SOI material 104 and insulator material 106 can each be deposited to a thickness of about 30 Å; although other thicknesses are contemplated by the invention.

Once the materials 104, 106 are deposited, a patterning process can be performed to form the fins 102. The patterning process can be, for example, a conventional SIT process or a lithographic and etching process. In embodiments, the SIT process will increase the density of the fins 102. The patterning will form a space 108 between the fins 102.

Figure 2:
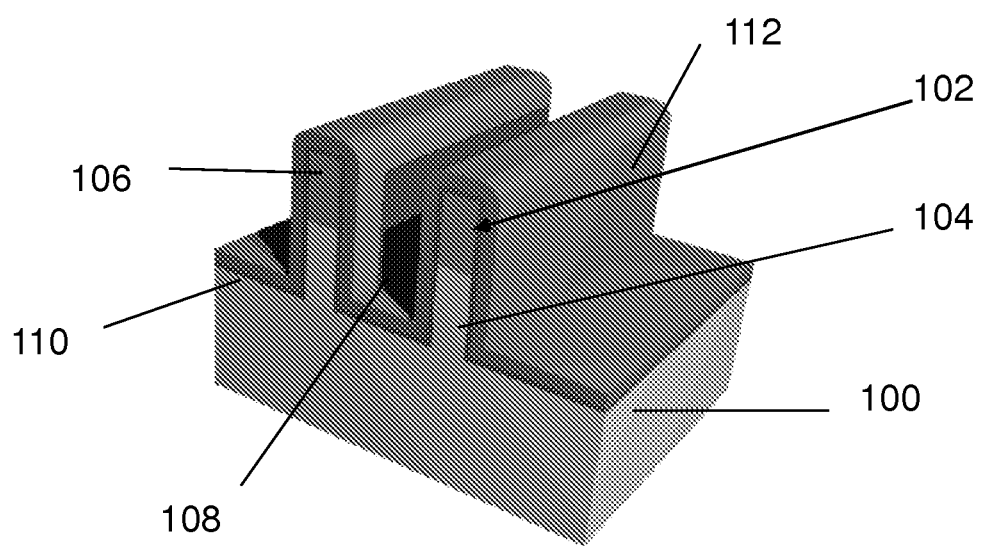
FIGS. 2-6 show structures and respective processing steps in accordance with aspects of the invention.

FIG. 2 shows the deposition of a dielectric material 110 and a gate material 112 over the fins 102 and within the space 108. In embodiments, the dielectric material 110 can be deposited to a thickness of about 10 Å to about 30 Å, and more preferably about 15 Å. The dielectric material 110 can be a high k dielectric such as, for example, hafnium oxide. However, other dielectric materials 110 are also contemplated by the present invention such as, for example, oxide, silicon oxide, silicon oxynitride, silicon oxynitride, or any combinations thereof such as, for example, a stack of dielectric materials. The gate material 112 can be, for example, deposited to a thickness of about 10 Å to about 100 Å. In embodiments, the gate material 112 can be, for example, a metal (e.g., TiN or TaN) or poly material.

The dielectric material 110 and the gate material 112 can be deposited using conventional deposition methods such as, for example, CVD or ALD processes. In the case of a metal gate, the gate material 112 can be also deposited using, for example, a conventional sputtering technique. In embodiments, a thin layer of metal such as, for example, aluminum, can also be deposited on the gate structure, also represented by reference numeral 112. The thin layer can be deposited to a thickness of about 5 Å; although other thicknesses are also contemplated by the present invention.

Figure 3:
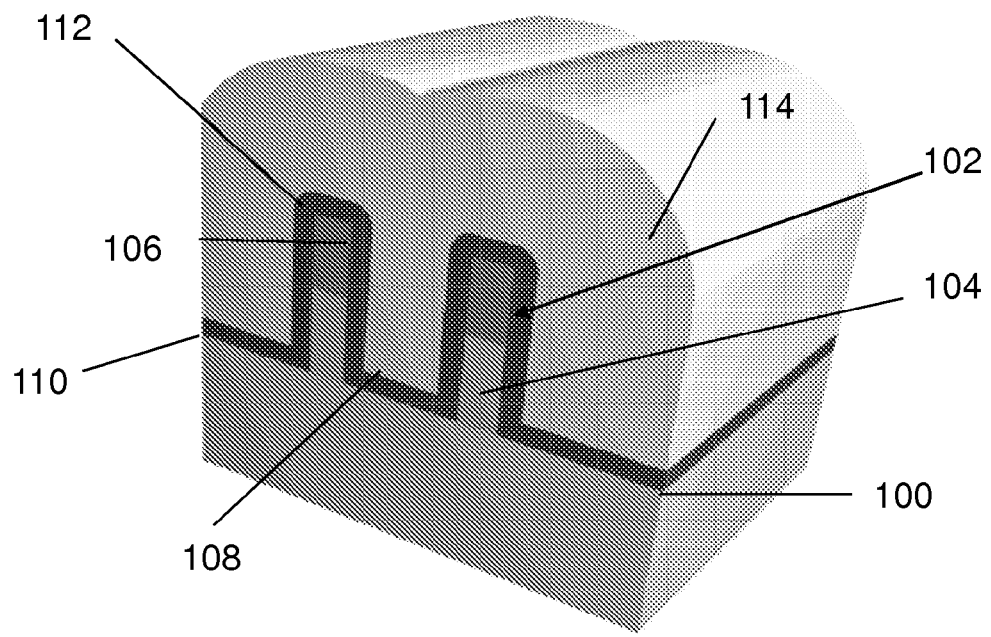

In FIG. 3, a cap material 114 is deposited on the gate material 112. The cap material 114 is a stress material that is deposited on the gate material 112, including within the space (e.g., gap) 108 between the fins 102 and on sides of the fins 102 (e.g., surrounding the fins 102). In embodiments, the stress material 114 merges the fins 102 in the source/drain areas and forms the gates. The cap material (stress material) 114 is an insulator material that will have a lattice constant different than that of the gate material 112. In embodiments, the lattice mismatch between the stress material 114 and the gate material 112 will result in a stress formation between the fins 102 (within the gap 108). The stress material 114 can be, for example, a nitride material which fills the gap 108 between the fins 102. The stress material 114 will eliminate the Ceff; in comparison to using an EPI material that will increase the Ceff of the device.

Figure 4:
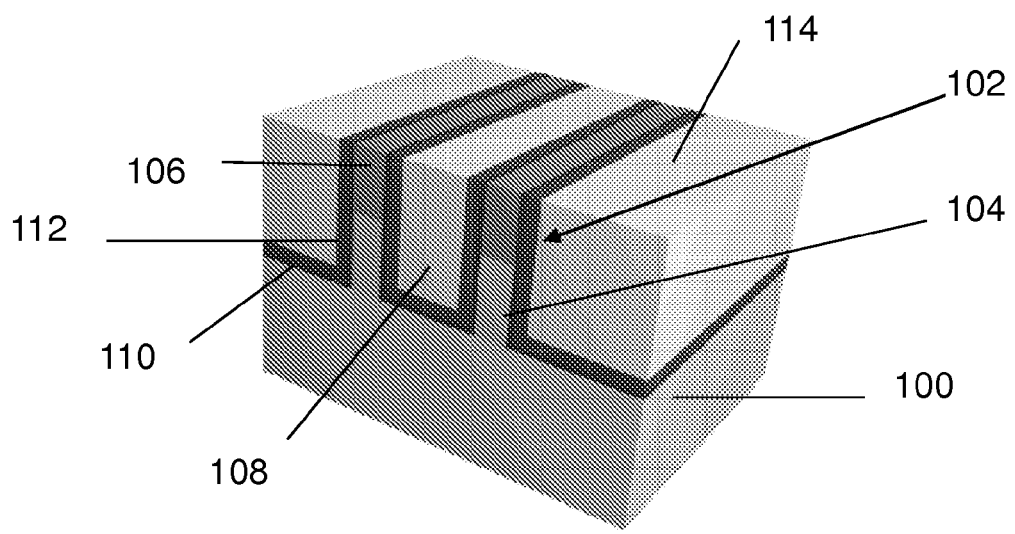

In FIG. 4, the stress material 114 is planarized using, for example, a CMP to near or onto the tops of caps 114 on the fins 102. In embodiments, complete removal of the stress material 114 from over fins 102 is optional. In embodiments, the gate material 112 and dielectric material 110 can also be polished; although this is not critical in practicing the present invention.

Figure 5:
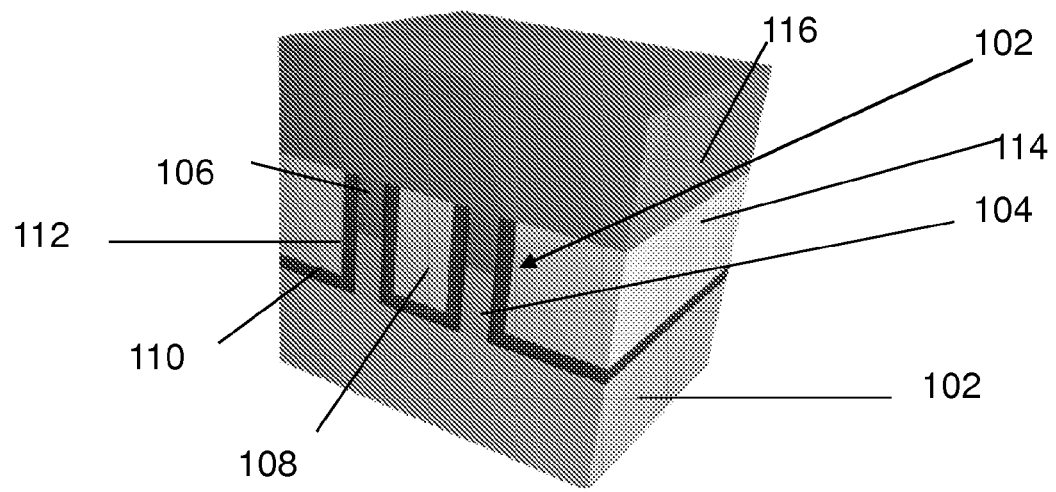

FIG. 5 shows a deposition of a conductive layer 116 on the planarized structure of FIG. 4. The conductive layer 116 can be, for example, tungsten or tungsten silicide, for example. The conductive layer 116 can also be capped with a hard mask, in embodiments. The hard mask is also represented by reference numeral 116.

Figure 6:
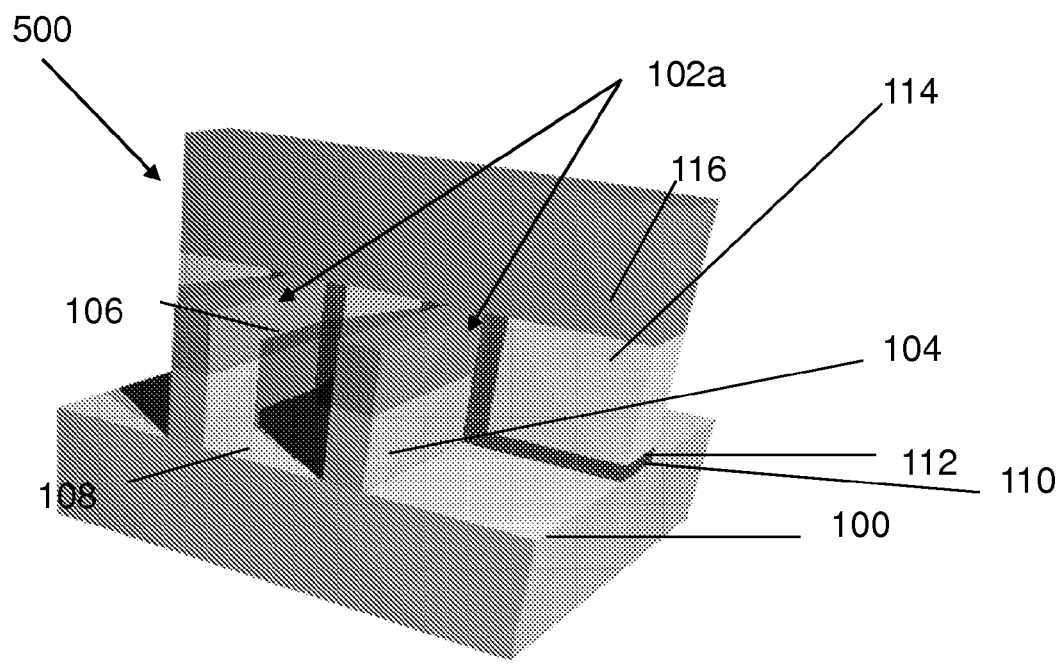

In FIG. 6, the structure undergoes a patterning process to form the finFET structure 500 of the present invention. The patterning can be performed by, for example, using a gate conductor mask, and patterning using a reactive ion etching (RIE) process. In this way, the gate stack 102a comprises the conductive layer 116, stress material 114, gate material 112, and dielectric 110. In embodiments, the patterned metal gate is the complete gate conductor for each finFET. Contact of this gate to other circuitry is through patterned conductive layer 112, connecting at intersections 118.

The stress material 114 will be provided between the fin structures 102a and will form the gate, which will effectively eliminate Ceff and provide stress to the structure between the fins 102a. Additionally, the patterned gate material 112 need not be silicided, as the patterned conductive layer 116 will provide a high-conductivity path for circuitry fabricated using the processes of the present invention. Also, the presence of the stress material 114 (i.e., insulating material) instead of a conductive material such as doped silicon will lower capacitance as well as impart stress through the gate thereby improving device performance.

Figure 7:
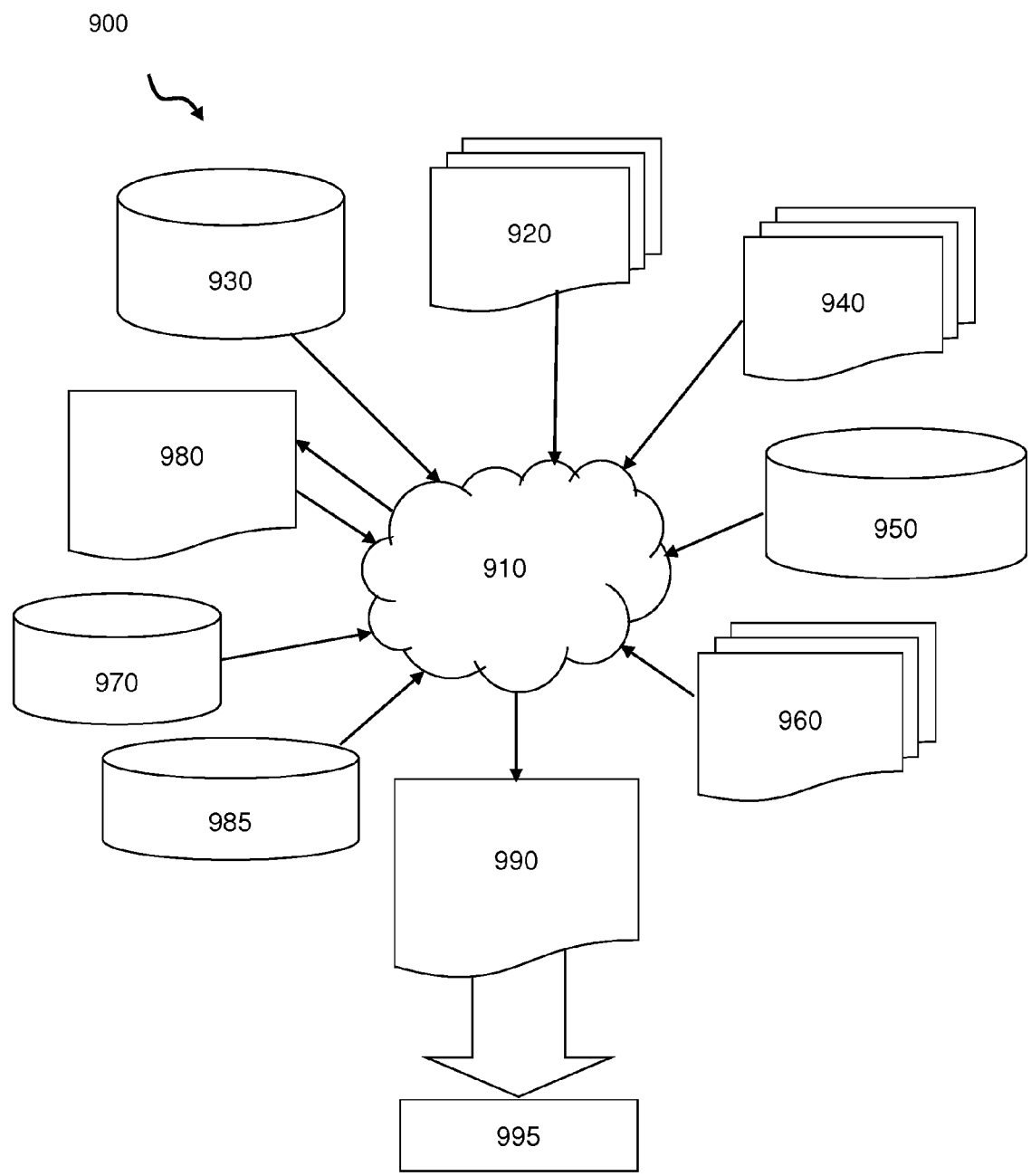
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
    forming finFET gate structures by depositing gate material comprising one of a poly and metal material and dielectric material on patterned fins; and
    merging the patterned fins in a source and drain region of the finFET gate structures by depositing and patterning insulative stress material on sides of adjacent patterned fins, wherein the insulative stress material completely fills a space between the patterned fins and forms part of the finFET gate structures.

2. The method of claim 1, wherein the patterned fins are formed by depositing SOI and insulator material on a substrate and patterning the SOI and insulator material.

3. The method of claim 1, wherein the patterned fins are formed by a sidewall image transfer process.

4. The method of claim 1, wherein the gate material and the dielectric material are deposited on the patterned fins and the stress material is deposited on the gate material in a space formed between the patterned fins.

5. The method of claim 1, further comprising patterning the insulative stress material.

6. The method of claim 1, wherein the insulative stress material has a lattice constant different than the gate material.

7. The method of claim 1, further comprising planarizing the insulative stress material and depositing a conductive material on the insulative stress material, prior to a patterning.

8. A method of forming a finFET structure, comprising:
    forming a plurality of finFET structures by depositing gate material comprising conductive material and dielectric material on patterned fins; and
    merging the patterned fins in a source and drain region of the finFET structures by forming a stress material forming a part of a gate stack of the plurality of finFET structures and in a space between adjacent ones of the patterned fins, wherein:
        the stress material completely fills the space between adjacent ones of the patterned fins to merge the adjacent ones of the patterned fins,
        the stress material has a lattice constant different than that of the gate material of the plurality of finFET structures,
        the stress material is an insulator and the conductive material is one of a poly and metal material, and
        the gate stack is formed from conductive material, the stress material, the gate material, and the dielectric material, in order.

9. The method of claim 8, wherein the stress material is a nitride material.

10. The method of claim 8, wherein the stress material is formed on both sides of the plurality of finFET structures.

11. The method of claim 8, wherein the stress material is insulative stress material.

12. The method of claim 11, further comprising planarizing the insulative stress material and depositing the conductive material on the insulative stress material, prior to a patterning.

* * * * *